(12) United States Patent
Wright

(10) Patent No.: US 11,070,211 B2
(45) Date of Patent: Jul. 20, 2021

(54) EVENT COUNTER CIRCUITS USING PARTITIONED MOVING AVERAGE DETERMINATIONS AND RELATED METHODS

(71) Applicant: Syzexion Inc., Chapel Hill, NC (US)

(72) Inventor: Gregory Michael Wright, Chapel Hill, NC (US)

(73) Assignee: Syzexion, Inc., Chapel Hill, NC (US)

( * ) Notice: Subject to any disclaimer, the term of this patent is extended or adjusted under 35 U.S.C. 154(b) by 0 days.

(21) Appl. No.: 16/887,560

(22) Filed: May 29, 2020

(65) Prior Publication Data

US 2020/0382123 A1 Dec. 3, 2020

Related U.S. Application Data

(60) Provisional application No. 62/855,855, filed on May 31, 2019.

(51) Int. Cl.
| | | |
|---|---|---|
| *H03K 21/00* | (2006.01) | |
| *H03K 23/40* | (2006.01) | |
| *G06F 11/34* | (2006.01) | |
| *G06F 11/30* | (2006.01) | |
| *H03K 23/00* | (2006.01) | |
| *H03K 21/40* | (2006.01) | |
| *H03K 21/10* | (2006.01) | |
| *H03K 23/54* | (2006.01) | |
| *H03K 21/02* | (2006.01) | |

(52) U.S. Cl.
CPC ......... *H03K 23/40* (2013.01); *G06F 11/3013* (2013.01); *G06F 11/3495* (2013.01); *H03K 21/00* (2013.01); *H03K 21/026* (2013.01); *H03K 21/10* (2013.01); *H03K 21/40* (2013.01); *H03K 21/403* (2013.01); *H03K 23/00* (2013.01); *H03K 23/54* (2013.01)

(58) Field of Classification Search
None
See application file for complete search history.

(56) References Cited

U.S. PATENT DOCUMENTS

| | | | |
|---|---|---|---|
| 5,602,761 A | 2/1997 | Spoerre et al. | |
| 7,426,253 B2 * | 9/2008 | Gara ................. | H03K 23/54 377/26 |
| 7,688,931 B2 | 3/2010 | Gara et al. | |
| 7,877,759 B2 * | 1/2011 | Gara ................. | G06F 11/348 719/318 |
| 8,345,816 B1 * | 1/2013 | Adiga ............... | G06F 1/04 377/26 |
| 8,660,234 B2 | 2/2014 | Bender et al. | |

(Continued)

*Primary Examiner* — Tuan T Lam
(74) *Attorney, Agent, or Firm* — Stanek Lemon Crouse & Meeks, P.A.

(57) ABSTRACT

An event counter circuit can be configured to monitor operation of a system where a moving average register circuit can be configured to store a moving average value updated in each cycle of operation of the system by adding a number of system events occurring during a current cycle of the system operation to either 1) a current moving average value stored in the moving average register circuit or 2) a keep value generated by partitioning the current moving average value into the keep value and a transfer value representing system events not included in a determination of the moving average value for subsequent cycles of operation of the system.

25 Claims, 6 Drawing Sheets

(56) References Cited

U.S. PATENT DOCUMENTS

| | | | | |
|---|---|---|---|---|
| 8,762,792 | B2* | 6/2014 | Greb | G06F 11/3013 |
| | | | | 714/47.1 |
| 9,088,284 | B2 | 7/2015 | Bender et al. | |
| 2010/0027735 | A1* | 2/2010 | Bender | H03K 23/42 |
| | | | | 377/49 |
| 2017/0004023 | A1* | 1/2017 | Bhartia | G06F 11/2289 |
| 2019/0303264 | A1* | 10/2019 | Chen | G06F 11/3495 |

* cited by examiner

EVENT COUNTER CIRCUITS USING PARTITIONED MOVING AVERAGE DETERMINATIONS AND RELATED METHODS

CLAIM FOR PRIORITY

This application claims priority to Provisional Application Ser. No. 62/855,855, titled Hybrid Counter With Moving Average Computation, filed in the U.S. Patent and Trademark Office on May 31, 2019, the entire disclosure of which is hereby incorporated herein by reference.

BACKGROUND

Performance counters are commonly used in computer systems to monitor the operation of the system. Typically, a central processing unit (CPU) core includes one or more event sources that can signal a performance monitoring unit when a monitored event occurs. In response the performance monitoring unit can increment a count of the number of such events. Typical monitored events may include the execution of an instruction, the detection of a cache miss, and the detection of a fault within the system. The number of monitored event sources may be greater than the number of implemented counters, in which case means may be provided to select which event source is to be monitored by a particular counter. Further, an indication can be provided if a count exceeds a threshold value, for example by generating an interrupt when a binary counter value rolls around from its maximum count to zero. The counter may also be reset to zero, or to some other value under control of the system.

Performance counter data can be used by hardware and software designers to measure the behavior and performance of the system. In addition, the performance counter data may be used to adjust policies and to tune parameters of the system during operation. Furthermore, variations in the rate of monitored events may be used to identify program phases, changes in workload, anomalies such as attacks or intrusions, and warn of failing hardware. Performance counters may not provide information indicating the rate at which events occur directly; instead, a rate may be determined by software reading an accumulated count of events at the beginning and at the end of a monitored time interval, computing the difference, and then dividing by the time interval.

One measure of average rate, biased towards more recent data, is referred to as the exponential moving average, which has been employed for example in machine fault detection. The exponential moving average can be provided for a time series of data $Y_t$, where the index variable t represents discrete time steps advancing 1, 2, 3, . . . , the exponential moving average $S_t$ at each point in the time series is conventionally defined recursively such that $$S_t = \alpha \cdot Y_t + (1-\alpha) \cdot S_{t-1}, t > 1$$

The parameter alpha $\alpha$, in the range zero to one, determines the rate at which older information decays out of the average. For convenience, the exponential moving average can be scaled by a constant factor by multiplying $S_t$ by $1/\alpha$ above, which has equivalent properties to the unscaled exponential moving average except for being numerically larger by the constant factor. When a data point in the time series corresponds to a time interval (for example, when the data point represents a count of a number of observed events within the time interval), the time boundary between adjacent such time intervals is commonly called an epoch.

The trend over time has been towards systems possessing more and wider counters. For example, a recent CPU may contain sixteen counters, each 64 bits wide. If implemented naively, for example with each counter including both a 64-bit wide adder (or incrementer) and 64 flip-flops, the performance monitoring hardware may represent a significant cost in terms of silicon area and power. Accordingly, techniques have been invented to reduce the cost of implementing multiple counters, by using dense addressable storage such as a register file or Static Random Access Memory (SRAM). In one such technique, a hybrid counter is employed, in which the least significant bits of the total count are maintained in a small counter circuit implemented with flip-flops and logic cells, with the more significant bits held in addressable storage where they may be updated less frequently. In other techniques, a small fast counter, such as a 'pre-counter' or 'delta-counter' maintains a short-term event count that is less frequently accumulated into a total count held in the addressable storage.

SUMMARY

Embodiments according to the invention can provide event counter circuits using partitioned moving average determinations and related methods. Pursuant to these embodiments, an event counter circuit can be configured to monitor operation of a system where a moving average register circuit can be configured to store a moving average value updated in each cycle of operation of the system by adding a number of system events occurring during a current cycle of the system operation to either 1) a current moving average value stored in the moving average register circuit or 2) a keep value generated by partitioning the current moving average value into the keep value and a transfer value representing system events not included in a determination of the moving average value for subsequent cycles of operation of the system.

In some embodiments according to the invention, a method of monitoring operation of a system can be provided by (a) storing a moving average value in a moving average register circuit, the moving average value including a number of system events occurring during a current epoch; (b) upon determining that a start of a next cycle of operation of the system does not indicate a start of a next epoch, adding a count of system events occurring during the next cycle of operation to the moving average value in the moving average register circuit; (c) upon determining that the start of the next cycle of operation of the system does indicate the start of the next epoch, partitioning the moving average value to provide a keep value and a transfer value; (d) upon the indication of the start of the next epoch, adding the transfer value to an older count value; (e) upon the indication of the start of the next epoch, using the keep value as an initial value of the moving average value for the next epoch (f) upon the indication of the start of the next epoch, adding the count of system events occurring during the next cycle of operation of the system to the initial value of the moving average value for the next epoch.

DETAILED DESCRIPTION OF EMBODIMENTS ACCORDING TO THE INVENTION

In the description that follows, like components have been given the same reference numerals, regardless of whether they are shown in different examples. Features that are described and/or illustrated with respect to one example may be used in the same way or in a similar way in one or more other examples and/or in combination with or instead of the features of the other examples. As used herein, the term "moving average" refers to a scaled or unscaled moving average, unless otherwise indicated.

Figure 1:
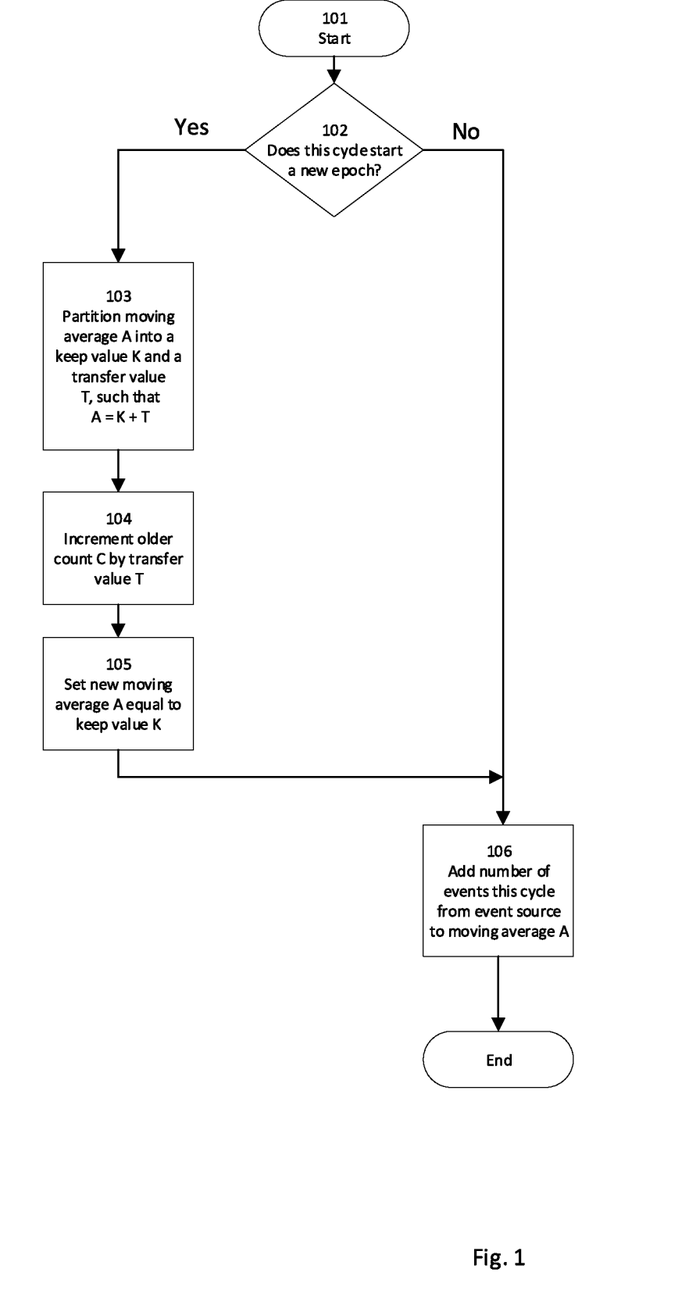
FIG. 1 is a flowchart illustrating methods of updating a moving average in response to events, and periodically updating the moving average and an older count at an epoch boundary in some embodiments according to the invention.

FIG. 1 is a flowchart illustrating methods of operating a hybrid counter circuit to update a moving average in response to events, and periodically updating the moving average and an older count at an epoch boundary in some embodiments according to the invention According to FIG. 1, a moving average can be determined and a derivable total count of the number of events detected can also be provided. The method can operate on two values: 1) a moving average A and 2) a count of older events C that are no longer included in a determination of the moving average.

The operations shown in FIG. 1 can be performed for each clock cycle or time step during which one or more events may be detected. In operation 102, it is determined whether the current cycle marks an epoch that is defined as a time interval that includes a plurality of clock cycles or time steps. For example, in some embodiments according to the invention, each epoch can be defined as a time interval of 32 clock cycles used for operations of a CPU core. The boundary between adjacent epochs could be indicated, for example, on the leading edge of the 33rd consecutive cycle of the clock signal used by the CPU core.

If the current cycle does not mark the boundary of an epoch, then the operations of the hybrid counter circuit continue by adding the number of event occurrences detected during the current clock cycle to the moving average A (operation 106). When the current cycle does indicate the boundary of an epoch (operation 102), then the current moving average A is partitioned into two values: 1) a value T ("Transfer") to be transferred to the count C of older events, and a value K ("Keep") to be used as the initial value for the moving average at the start of the next epoch (operation 103).

The value T generated by the partition is added to the count of older events (operation 104) and the value K is stored as initial value for the moving average A at the start of the next epoch (operation 105). In some embodiments, the value T equals alpha multiplied by A, and the value K equals (1-alpha) multiplied by A, for some value of the parameter alpha. In some embodiments, A is maintained as an integral value, and both K and T are rounded to integral values while maintaining that A equals the sum of K and T. In still other embodiments, the value alpha equals 0.5, multiplication by alpha and by (1-alpha) correspond to division by two, and any remainder after A's integral division by two is added to the value of T.

It will be understood that, as shown in FIG. 1, while the operations 103-105 are performed, the hybrid counter circuit continues to add the number of event occurrences detected during the current clock cycle to the moving average A (operation 106). Accordingly, whether or not the cycle marks the boundary of an epoch, the number of events detected in the current cycle is accumulated into moving average A.

It will be seen that, at an epoch, the moving average A equals the number of events observed since the last epoch, plus the value (1-alpha) multiplied by the moving average at the previous epoch. Furthermore, the method maintains the invariant that at any time the total number of events observed is equal to the sum of A plus C.

Figure 2:
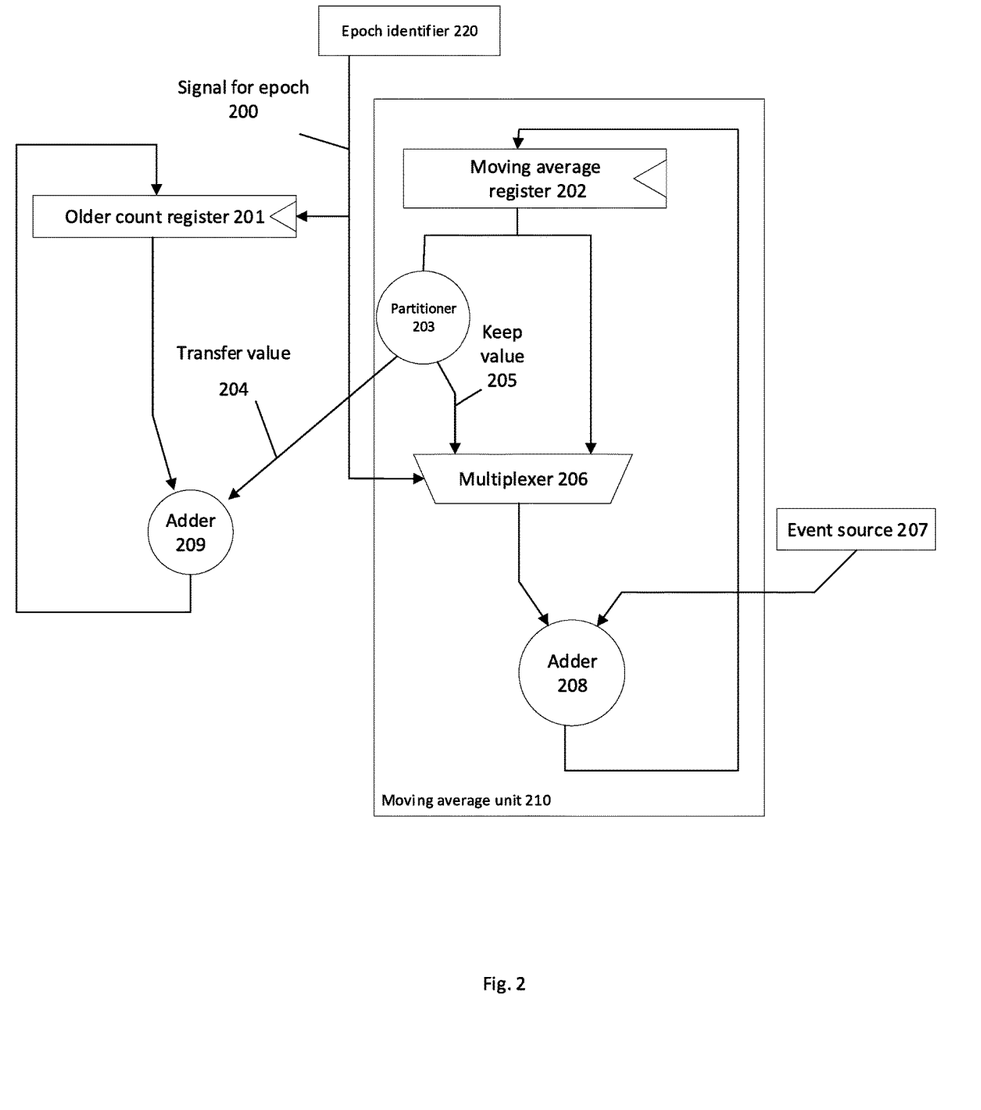
FIG. 2 is a block diagram illustrating a single hybrid counter circuit providing both a total event count and a moving average, wherein the moving average and an older count are stored in hardware register circuits in some embodiments according to the invention.

FIG. 2 is a block diagram illustrating a single hybrid counter circuit 200 providing both a total event count and a moving average, wherein the moving average and an older count are stored in hardware register circuits in some embodiments according to the invention. According to FIG. 2, the moving average A is stored in register circuit 202 included in a moving average unit 210 that is configured to generate and maintain the moving average for the events detected from the event source 207 for each epoch and to provide a portion of the moving average value to generate a count of older events that are no longer included in the determination of the moving average A. In some embodiments, the older count is stored in older count register circuit 201.

A signal for epoch 200 indicates whether a given cycle indicates the boundary of an epoch, as determined by epoch identifier 220. In some embodiments, the epoch identifier 220 is a 5-bit binary counter that is configured to detect when the counter overflows, such that signal for epoch 200 is asserted, for example, every 32nd clock cycle. In some embodiments, epoch identifier 220 is programmable so that the interval between epochs for the hybrid counter circuit is adjustable under software control.

If signal for epoch 200 is not asserted, multiplexer circuit 206 and adder circuit 208 act to accumulate any events observed in the current cycle from event source 207 into moving average register 202. For example, the value stored in the moving average register 202 is coupled, via the multiplexer 206, to a first input of the adder circuit 208, along with the event source 207 coupled to a second input of the adder circuit 208, which is used to provide the updated moving average for storage in the moving average register circuit 202.

If signal for epoch 200 is asserted, then the value from moving average register 202 is partitioned by partitioner circuit 202 into a transfer value 204 and a keep value 205, such that the sum of transfer value 204 and keep value 205 equals the value in the moving average register 202. Adder circuit 209 acts to accumulate the transfer value 204 and the value stored in the older count register circuit 201, which is enabled by the signal for epoch 200. If signal for epoch 200 is asserted, then the multiplexer circuit 206 selects the keep value 205 as the input to adder circuit 208, which adds any events observed from event source 207 in the current cycle to the keep value 205. The moving average register circuit 202, multiplexer circuit 206, and adder circuit 208, are sized such that the moving average value will not overflow, given the maximum number of events that may be generated by event source 207 between one epoch and the next, and the maximum value of a keep value 205. In some embodiments, a signal for epoch 200 is asserted once every 32 clock cycles; an event source 207 signals an event at most once per clock cycle; moving average register circuit 202, multiplexer circuit 206, adder circuit 208, and the transfer value 204 may be each 6 bits; keep value 205 may be 5 bits wide; and the older count register circuit 201 and the adder circuit 209 may each be 64 bits.

In some embodiments, the partitioner circuit 203 can be a division by 2 circuit, implemented as a right-shift by one place in binary arithmetic; any remainder from integer division by 2 (that is, the least significant bit of the input to division) is included as part of transfer value 204 to be added by adder 208 as a carry input.

It will be seen that, in any clock cycle, the moving average register 202 contains the sum of the keep value 205 from the previous epoch and the total number of events observed from event source 207 since the previous epoch. Furthermore, in any cycle, the sum of the content in the moving average register circuit 202 and older count register circuit 201 equals the total number of events observed from event source 207 since the system began operation or was last reset.

In some embodiments, the contents stored by the moving average register circuit 202 and the older count register circuit 201 can be reset to zero under the control of software. In some embodiments, the contents of the moving average register circuit 202 and the older count register circuit 201 can be set to a value determined by software.

In some embodiments, the moving average register circuit 202 is extended to include additional low order fractional bits in a binary representation, and the partitioner circuit 203 is configured to determine the transfer value 204 to be the value of moving average register 202 divided by two and rounded down to the nearest integer, plus the lowest order fractional bit of moving average register circuit 202 interpreted with unity weight. The partitioner circuit 203 can also be configured to determine the keep value 205 as the value of moving average register circuit 202 right shifted by one, including shifting through the fractional bits. In this embodiment, the total number of events observed equals the sum of the moving average register circuit 202 and the older count register circuit 201, where the fractional bits of the moving average register circuit 202 are each counted with unity weight (not binary fractional weight).

Figure 3:
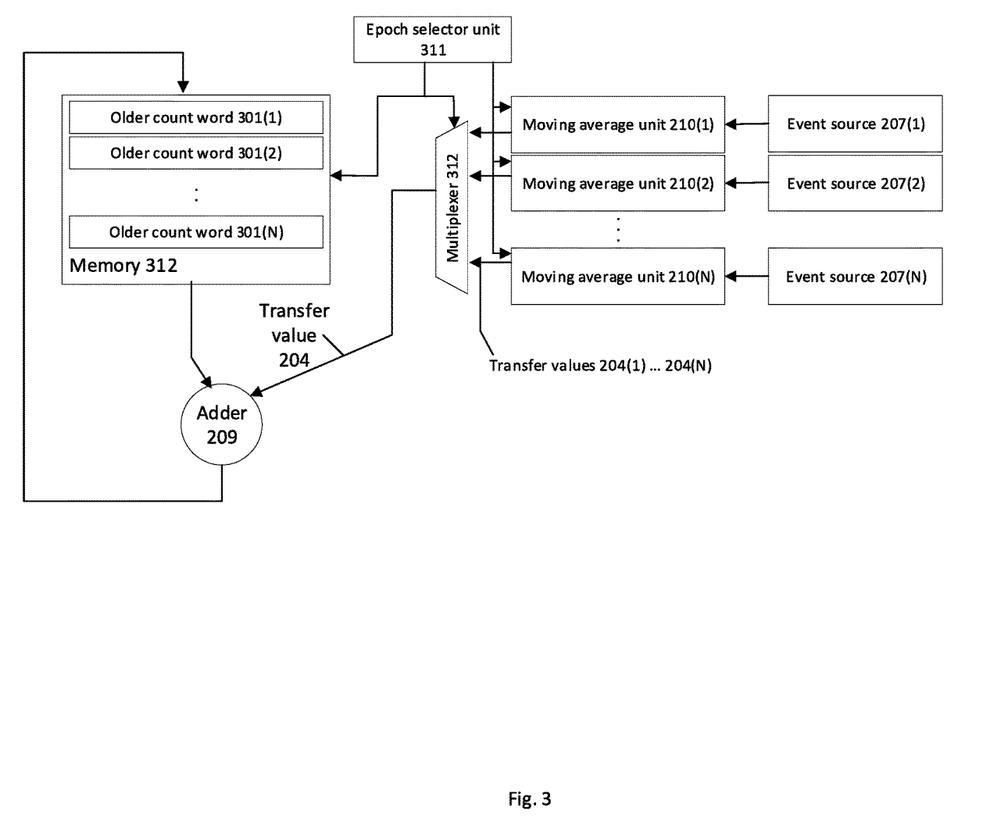
FIG. 3 is a block diagram illustrating an update circuit for multiple hybrid counter circuits, wherein older counts are stored in addressable memory in some embodiments according to the invention.

FIG. 3 is a block diagram illustrating an update circuit 300 including multiple hybrid counter circuits, wherein older counts are stored in addressable memory in some embodiments according to the invention. As shown in FIG. 3, the update circuit 300 includes a plurality of the moving average units 210(1)-210(N) and a plurality of older count words 301(1)-301(N) storing respective older count values in a memory 312.

An epoch selector unit 311 selects one of the moving average units 210(1)-210(N) to start a new epoch, controls multiplexer circuit 312 to pass the respective transfer value 204(1)-204(N) from the selected moving average unit 210, and causes the memory 312 to read the older count word 301(1)-301(N) that corresponds to the selected moving average unit 210. Adder circuit 209 sums the selected transfer value and the read older count word, and the memory 312 writes the sum from adder circuit 209 into the older count word corresponding to the selected moving average unit 210.

In some embodiments, epoch selector unit 311 selects one moving average unit in round robin fashion (i.e., a round-robin selection from among the moving average units) per epoch. In some embodiment, the epoch selector unit 311 selects a given moving average unit once every 64 (or another fixed number of) cycles. In some embodiments, the epoch selector unit 311 is programmable so that the user may vary the interval between one epoch and the next for a given counter. Other types of selection may be used.

In some embodiments, the epoch selector unit 311 does not count time towards a time interval during which a CPU core or an event source are clock gated. In some embodiments, the epoch selector unit 311 determines epochs using real time (for example, using a fixed frequency clock), rather than CPU clock cycles that may be subject to voltage and frequency scaling.

Figure 4:
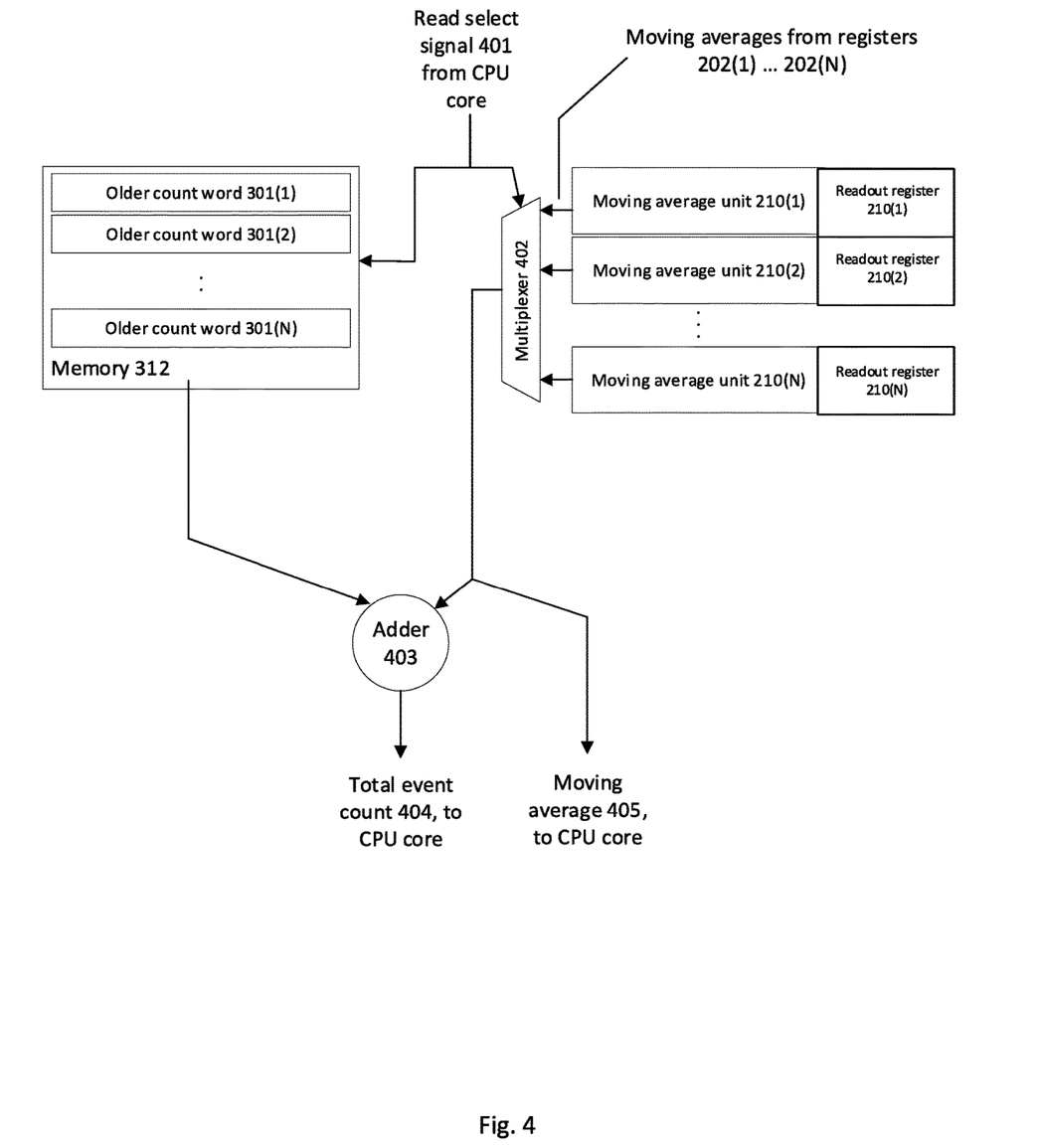
FIG. 4 is a block diagram illustrating a readout circuit including multiple hybrid counters, whereby a central processing unit may read one of the hybrid counters to obtain a total count and moving average in some embodiments according to the invention.

FIG. 4 is a block diagram illustrating a readout circuit 400 including multiple hybrid counters, whereby a central processing unit may read one of the hybrid counters to obtain a total count and moving average in some embodiments according to the invention. In some embodiments, the CPU core may read a total event count 404 and moving average 405 from one of the plurality of moving average units 210(1)-210(N) and older count words 301(1)-(N) from the readout circuit 400. The CPU core sends a read select signal 401 to the multiplexer circuit 402 and to the plurality of older count words 301(1)-301(N) indicating which hybrid counter circuit it to be read. In response, the multiplexer circuit 402 selects the addressed moving average value 405 from the corresponding moving average unit, and memory 312 reads the corresponding older count word from 301(1)-301(N). Adder circuit 403 adds the moving average value 405 to the older count word, to provide the total event count 404 to the CPU core.

In some embodiments, the CPU core may only read the moving average 405 at an epoch for the selected moving average unit 210(1)-210(N). In some embodiments, the moving average unit 210 may be extended to include a readout register circuit 210(1)-210(N) that captures the value from moving average register 202 at an epoch, the readout register circuit 210(1)-210(N) providing the moving average value into multiplexer 402 to be read by the CPU core. In this manner, the CPU core may read a moving average corresponding to the previous epoch, and does not observe an intermediate computation of the moving average in the middle of a time interval.

Figure 5:
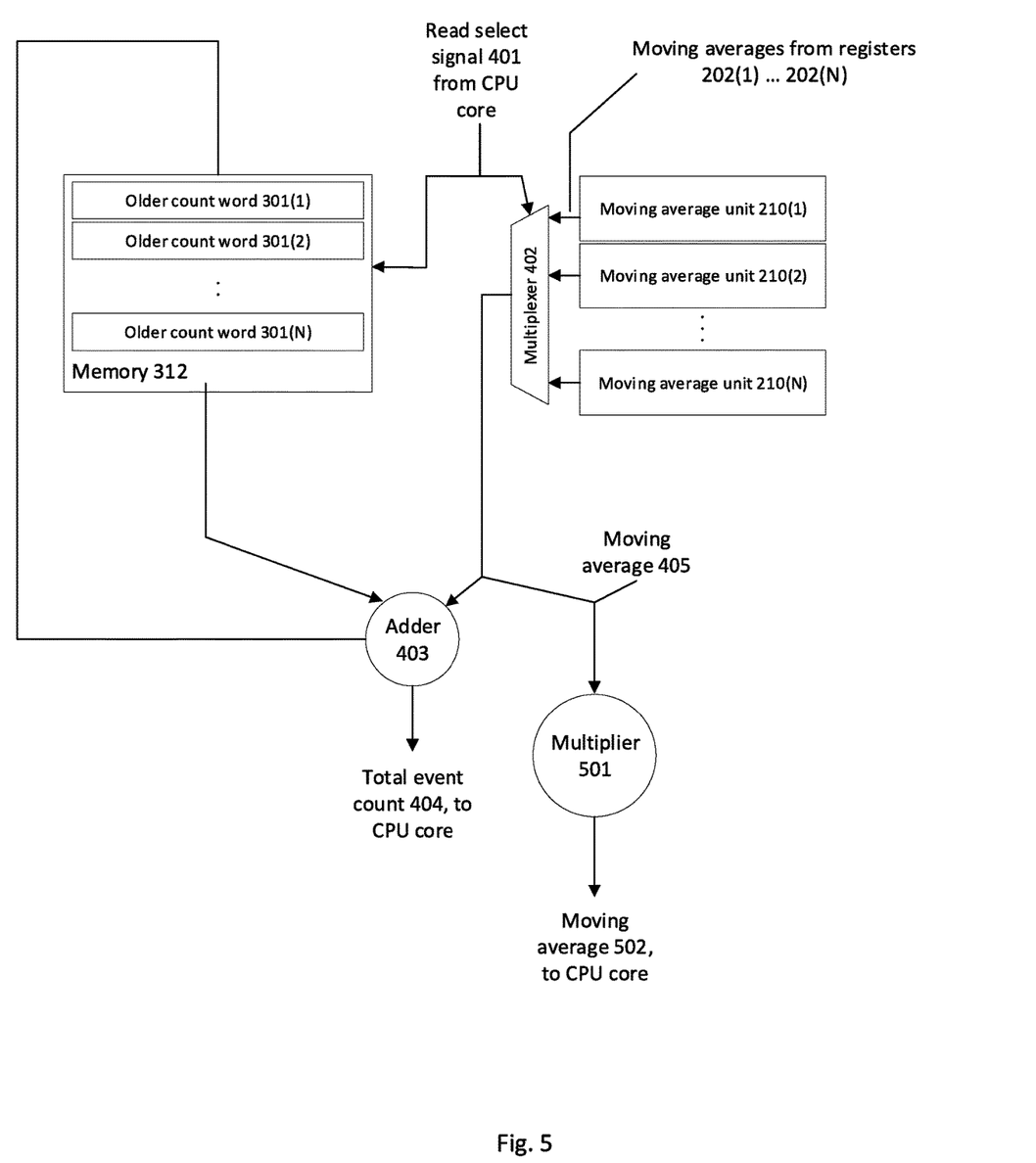
FIG. 5 is a block diagram illustrating the readout circuit of FIG. 4, coupled to a multiplier circuit configured to scale the moving average before it is provided to the central processing unit in some embodiments according to the invention.

FIG. 5 is a block diagram illustrating the readout circuit 400 of FIG. 4, coupled to a multiplier circuit 501 configured to scale the moving average before it is provided to the CPU core in some embodiments according to the invention. According to FIG. 5 the moving average value 405 that is read out at an epoch is not sent directly to the CPU core; instead it is scaled by the multiplier circuit 501, which multiplies the moving average 405 by the factor alpha to form moving average 502. The moving average 502 is provided to the CPU core as the result of the read operation. In some embodiments, alpha equals 0.5, and multiplier circuit 501 is implemented as a binary right shift by one place.

Figure 6:
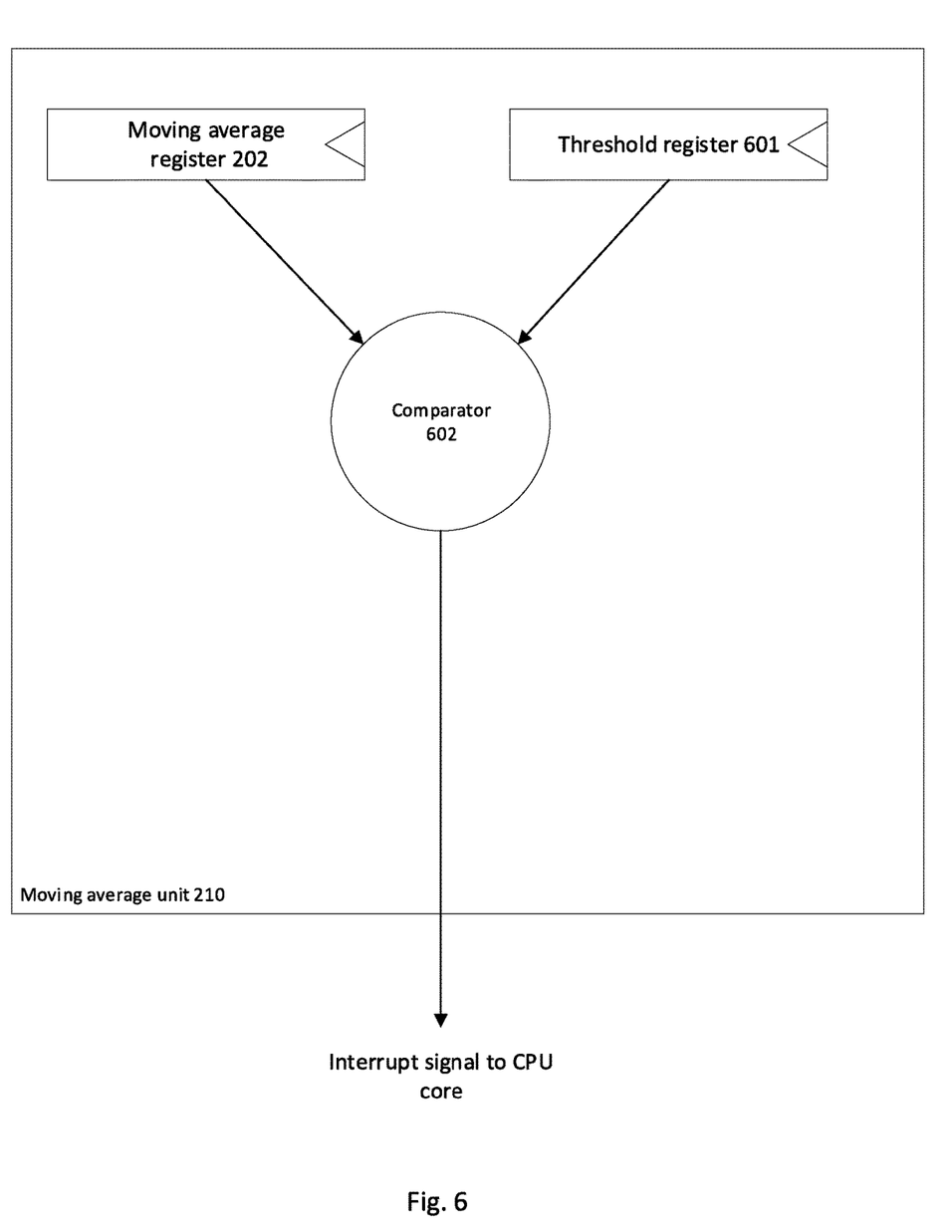
FIG. 6 is a block diagram illustrating a circuit configured to generate an interrupt if a moving average falls outside a specified range in some embodiments according to the invention.

FIG. 6 is a block diagram illustrating a circuit configured to generate an interrupt if a moving average falls outside a specified range in some embodiments according to the invention. According to FIG. 6 the moving average unit 210 is extended to include a threshold register circuit 601 containing a maximum acceptable value; comparator circuit 602 compares the value of moving average register circuit 202 to the value of threshold register circuit 601 and signals an interrupt to a CPU core if the threshold value is exceeded. In some embodiments, the comparator circuit 602 is configured to signal an interrupt if the value in moving average register circuit 202 falls below a minimum acceptable value in the threshold register circuit 601, where such a signal is only generated at an epoch. In some embodiments, the threshold register circuit 601 contains both a minimum and maximum value to indicate a desired range, and the comparator circuit 602 is configured to signal an interrupt if the value in moving average register circuit 202 is outside the designated range at an epoch.

When applied to CPU performance monitoring in a silicon integrated circuit, an embodiment may employ standard-cell flip-flops to form the register circuits (including moving average register circuit 202) in the previous descriptions, and a register file based upon static random access memory (SRAM) cells to provide the memory 312 storing the older counts. However, other circuit technologies may be employed within the scope of the invention for both register and memory storage, including without limitation latch cells, dynamic random access memory, flash memory, magnetic random access memory (MRAM), or phase change memory.

Although presented in terms of CPU performance monitoring, this invention is in no way limited in scope to that application, but may be employed to maintain a total count and moving average in any system that monitors discrete events, including, but not limited to, microcontrollers, embedded processors, graphics processors, digital signal processors, networking and communication devices, storage and peripheral devices, game controllers, vehicles, transportation equipment, health monitoring devices, industrial machinery, and process controllers. Furthermore, embodiments of this invention are not limited to electronic integrated circuits, but may utilize computational and storage structures including but not limited to electronic, mechanical, electromechanical, optical, quantum mechanical, phase change, fluidic, chemical, or biological technologies.

As further appreciated by the present inventor, an embodiment of the invention was implemented using SystemVerilog RTL and mapped to targeting a commercial FPGA, and compared to a conventional counter implementation as a baseline design. The baseline design included sixteen 64-bit counters, suitable for monitoring sixteen independent event sources, which required 272 look-up tables (LUTs) and 1088 registers in the FPGA, which provided only the total count of prior events for each source. In contrast, the implementation in accordance with the present invention occupies only 288 LUTs and 153 registers, a 67% reduction in resource utilization, with the additional functionality of providing a moving average for each event source.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the various embodiments described herein. As used herein, the term "and/or" includes any and all combinations of one or more of the associated listed items.

The terminology used herein is for the purpose of describing particular embodiments only and is not intended to be limiting to other embodiments. As used herein, the singular forms "a" "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or otherwise structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

What is claimed:

1. A method of monitoring operation of a system, the method comprising:
   (a) storing a moving average value in a moving average register circuit, the moving average value including a number of system events occurring during a current epoch;
   (b) upon determining that a start of a next cycle of operation of the system does not indicate a start of a next epoch, adding a count of system events occurring during the next cycle of operation to the moving average value in the moving average register circuit;
   (c) upon determining that the start of the next cycle of operation of the system does indicate the start of the next epoch, partitioning the moving average value to provide a keep value and a transfer value;
   (d) upon the indication of the start of the next epoch, adding the transfer value to an older count value;
   (e) upon the indication of the start of the next epoch, using the keep value as an initial value of the moving average value for the next epoch; and
   (f) upon the indication of the start of the next epoch, adding the count of system events occurring during the next cycle of operation of the system to the initial value of the moving average value for the next epoch.

2. The method of claim 1 wherein a weighting decrease parameter $\alpha$ is configured to reduce contribution of the moving average values determined for previous epochs to the moving average value for the current epoch as a decaying exponential function; and
   partitioning the moving average value to provide the keep value and the transfer value further comprises:
   multiplying the moving average value stored in the moving average register circuit by $(1-\alpha)$ to provide the keep value; and
   multiplying the moving average value stored in the moving average register circuit by $\alpha$ to provide the transfer value.

3. The method of claim 1 wherein using the keep value as an initial value of the moving average value for the next epoch comprises overwriting the moving average register with the keep value to provide the initial value of the moving average value.

4. The method of claim 1 wherein using the keep value as an initial value of the moving average value for the next epoch comprises adding the keep value to the count of system events occurring during the next cycle to provide the initial value of the moving average value for the next epoch.

5. The method of claim 4 further comprising:
storing the initial value of the moving average value in the moving average register circuit after a first cycle of the next epoch.

6. The method of claim 1 wherein operations (a)-(c) and (e)-(f) are carried out using synchronous logic and operation (d) comprises accessing an older count value in an addressable memory which is added to the transfer value.

7. The method of claim 6 wherein operations (a)-(f) provide an instantiation of monitoring the operation of the system, the method further comprising:
providing a plurality of instantiations of monitoring the operation of the system, wherein each of the plurality of instantiations is selected for operation during a respective time interval of operation of the system.

8. The method of claim 7 wherein the respective time interval of operation of the system comprises a single epoch or a programmable number of cycles of operation of the system.

9. The method of claim 7 wherein a sum of the older count value and the moving average value represents a total number of system events occurring during system operation, the method further comprising:
receiving a read operation to access the moving average value for a selected one of the plurality of instantiations of monitoring the operation of the system; and
transmitting the moving average value for the selected one of the plurality of instantiations of monitoring the operation of the system responsive to the read operation.

10. The method of claim 7 wherein a sum of the older count value and the moving average value represents a total number of system events occurring during system operation, the method further comprising:
receiving a read operation to access an epochal moving average value determined for an immediately previous epoch for a selected one of the plurality of instantiations of monitoring the operation of the system; and
transmitting the epochal moving average value for the selected one of the plurality of instantiations of monitoring the operation of the system responsive to the read operation.

11. The method of claim 9 further comprising:
adding the moving average value to the older count for the selected one of the plurality of instantiations of monitoring the operation of the system to provide a total count for the selected one of the plurality of instantiations of monitoring the operation of the system; and
transmitting the total count for the selected one of the plurality of instantiations of monitoring the operation of the system responsive to the read operation.

12. The method of claim 11 wherein transmitting the moving average value for the selected one of the plurality of instantiations of monitoring the operation of the system responsive to the read operation comprises:
multiplying the moving average value for the selected one of the plurality of instantiations of monitoring the operation of the system by a scaling factor responsive to the read operation.

13. The method of claim 1 wherein adding the count of system events occurring during the next cycle to the moving average value in the moving average register circuit is followed by:
generating an interrupt signal responsive to determining that the moving average value is greater than a predetermined threshold value.

14. The method of claim 1 wherein upon determining that the start of the next cycle of operation of the system does indicate the start of the next epoch is followed by:
generating an interrupt signal responsive to determining that the moving average value is less than a predetermined threshold value.

15. The method of claim 1 wherein upon determining that the start of the next cycle of operation of the system does indicate the start of the next epoch is followed by:
generating a first interrupt signal responsive to determining that the moving average value is less than a first predetermined threshold value; and
generating a first interrupt signal responsive to determining that the moving average value is greater than a second predetermined threshold value.

16. An event counter circuit configured to monitor operation of a system, the circuit comprising:
a moving average register circuit configured to store a moving average value updated in each cycle of operation of the system by adding a number of system events occurring during a current cycle of the system operation to either 1) a current moving average value stored in the moving average register circuit or 2) a keep value generated by partitioning the current moving average value into the keep value and a transfer value representing system events not included in a determination of the moving average value for subsequent cycles of operation of the system.

17. The circuit of claim 16 further comprising:
a partitioner circuit coupled to the current moving average value stored in the moving average register circuit and configured to generate the keep value and the transfer value from the current moving average value;
a multiplexer circuit including:
a first input coupled to the current moving average value stored in the moving average register circuit;
a second input coupled to the keep value output by the partitioner circuit; and
a select input configured to switch the keep value from the second input to an output of the multiplexer circuit responsive to an indication that the current cycle is a start of a next epoch of the system operation or to switch the current moving average value from the first input to the output of the multiplexer circuit responsive to an absence of the indication that the current cycle is the start of the next epoch of the system operation; and
an adder circuit configured to add the number of system events occurring during the current cycle of the system operation to the output of the multiplexer circuit to provide an updated moving average value to an input of the moving average register circuit.

18. The circuit of claim 17 wherein a weighting decrease parameter α is configured to reduce contribution of moving average values determined for previous epochs to the moving average value for a current epoch as a decaying exponential function; and
wherein the partitioner circuit comprises a circuit configured to multiply the moving average value stored in the moving average register circuit by (1−α) to provide the keep value and configured to multiply the moving average value stored in the moving average register circuit by α to provide the transfer value.

19. The circuit of claim 18 further comprising:
an older count register circuit configured to store an older count value indicating an accumulated number of system events occurring during previous epochs of system operation; and
an older count adder circuit including a first input coupled to the transfer value and a second input coupled to the older count value stored in the older count register circuit, the older count adder circuit configured to add the first input to the second input to provide an updated older count valued to update the older count register circuit responsive to the indication that the current cycle is the start of the next epoch of the system operation.

20. The circuit of claim 19 wherein the moving average register circuit, the partitioner circuit, the multiplexer circuit, the adder circuit comprise one of a plurality of moving average circuits each configured to operate responsive to a respective epoch of the system operation;
wherein the older count register circuit comprises one of a plurality of older count register circuits each configured to operate responsive to the respective epoch of the system operation, the moving average register circuit further comprising:
an epoch selector circuit coupled to the plurality of moving average circuits and to the plurality of older count register circuits, the epoch selector circuit configured to provide a select signal to enable at least one of the plurality of moving average circuits and at least one of the plurality of older count register circuits to determine the moving average value and the older count value using the enabled at least one of the plurality of moving average circuits and using the enabled at least one of the plurality of older count circuits;
a moving average circuit multiplexer having a plurality of inputs coupled to respective ones of the plurality of moving average registers included in the plurality of moving average circuits and having a moving average circuit select input coupled to the multiplexer moving average circuit multiplexer to output the moving average value from the enabled at least one of the plurality of moving average circuits to the older count adder circuit; and
an older count selector responsive to the epoch selector circuit to output the older count value from the enabled at least one of the plurality of older count circuits to the older count adder circuit.

21. The circuit of claim 20 wherein the older count register circuit comprises an addressable memory.

22. The circuit of claim 19 wherein the moving average register circuit, the partitioner circuit, the multiplexer circuit, the adder circuit comprise one of a plurality of moving average circuits each configured to operate responsive to a respective epoch of the system operation;
wherein the older count register circuit comprises one of a plurality of older count register circuits each configured to operate responsive to a respective epoch of the system operation, the moving average register circuit further comprising:
a moving average circuit multiplexer having a plurality of inputs coupled to respective ones of the plurality of moving average registers included in the plurality of moving average circuits, the moving average circuit multiplexer operating responsive to a read select signal from a CPU core to output the moving average value from the moving average circuit identified by the read select signal to the older count adder circuit and to the CPU core; and
wherein the plurality of older count circuits are responsive to the read select signal to output the older count value from the older count circuit identified by the read select signal to the older count adder circuit;
wherein the older count adder circuit is configured to add the older count value to the moving average value to provide a total count value to the CPU core.

23. The circuit of claim 19 wherein the plurality of moving average circuits each include a respective readout register circuit configured to store a previous epoch moving average value determined by each respective moving average register circuit for a previous epoch of the system operation, wherein each moving average circuit provides the previous epoch moving average value stored therein responsive to the read select signal from the CPU core.

24. The circuit of claim 19 wherein the moving average register circuit, the partitioner circuit, the multiplexer circuit, the adder circuit comprise one of a plurality of moving average circuits each configured to operate responsive to a respective epoch of the system operation;
wherein the older count register circuit comprises one of a plurality of older count register circuits each configured to operate responsive to a respective epoch of the system operation, the moving average register circuit further comprising:
a moving average circuit multiplexer having a plurality of inputs coupled to respective ones of the plurality of moving average registers included in the plurality of moving average circuits, the moving average circuit multiplexer operating responsive to a read select signal from a CPU core to output the moving average value from the moving average circuit identified by the read select signal;
a multiplier circuit coupled to moving average circuit multiplexer and configured to multiply the moving average value from the moving average circuit identified by the read select signal by a scaling factor to provide a scaled moving average value to the CPU core;
wherein the plurality of older count circuits are responsive to the read select signal to output the older count value from the older count circuit identified by the read select signal to the older count adder circuit;
wherein the older count adder circuit is configured to add the older count value to the moving average value to provide a total count value responsive to the CPU core.

25. The circuit of claim 16 further comprising:
a threshold register configured to store a threshold value;
a comparator circuit have a first input coupled to the moving average register circuit and a second input coupled to the threshold value, wherein the comparator circuit is configured to generate an interrupt responsive to the moving average value relative to the threshold value.

* * * * *